HIGH FREQUENCY SHORT PULSE TRIGGER GENERATOR EMPLOYING TWO VOLTAGE VARIABLE SEMICONDUCTIVE CAPACITORS
Filed Dec. 16, 1963

INVENTOR.
SAMUEL L. BROADHEAD JR.
BY
Moody and Kintzinger
ATTORNEYS

United States Patent Office 3,270,214

Patented August 30, 1966

3,270,214

HIGH FREQUENCY SHORT PULSE TRIGGER GENERATOR EMPLOYING TWO VOLTAGE VARIABLE SEMICONDUCTIVE CAPACITORS

Samuel L. Broadhead, Jr., Cedar Rapids, Iowa, assignor to Collins Radio Company, Cedar Rapids, Iowa, a corporation of Iowa Filed Dec. 16, 1963, Ser. No. 330,947
10 Claims. (Cl. 307—88.5)

Figure 1:
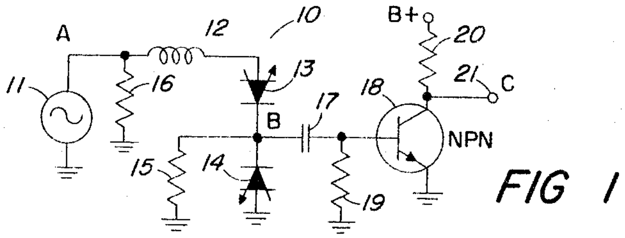

This invention relates in general to pulse generators, and in particular to a high frequency short pulse trigger generator with fast rise time and fall time output trigger pulses of very short duration, having a repetition frequency related to the frequency of an applied reference input signal.

It is necessary with high frequency signals employed in many areas of electronics today to form precisely shaped high frequency trigger pulses for utilization in circuitry of many equipments. One area of use where particularly shaped trigger pulses of a pulse generator can be of considerable importance is, for example, with frequency multipliers. With such multipliers, as with the "Multiple Crystal Frequency Selective Multiplier" of my copending application S.N. 331,058, filed December 16, 1963, it can be quite important that the trigger pulses developed by a pulse generator be quite narrow, and possibly as narrow as a half cycle of the highest useful frequency output developed by the frequency multiplier. Further, it is necessary that the repetitive trigger pulses generated be so spaced that, although not occurring during each cycle of the higher frequency multiplier output frequencies, they do occur through the same portion of the output frequency cycles coinciding with respective trigger pulses.

It is, therefore, a principal object of this invention to obtain a pulse generator output of relatively very narrow pulses with fast rise and fast fall times having a repetition frequency the same as the frequency of an applied reference input signal.

A further object is to provide highly accurate uniform spacing of output pulses and for the spacing of pulses to be substantially equal to the wave length of the applied reference input signal.

Features of this invention useful in accomplishing the above objects, in a highly reliable, economical pulse generator circuit utilizing generally fewer components for producing very narrow output pulses, include two voltage variable capacitors (Varicaps) having an electrode of one connected to the like electrode of another. A reference input signal source is connected to the other electrode of one Varicap, while the other electrode of the other Varicap is connected to ground, and there is a D.-C. circuit path around each Varicap from one electrode to the other. The common junction between the Varicaps is coupled to the base of a transistor which is voltage biased to conduct and amplify only peaks of the voltage waveform developed at the common junction of the Varicaps as a narrow pulse output at the collector of the transistor.

Specific embodiments representing what are presently regarded as the best modes for carrying out the invention are illustrated in the accompanying drawing.

Figure 2:
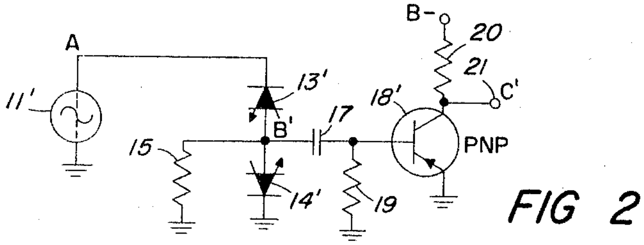
Figure 3:
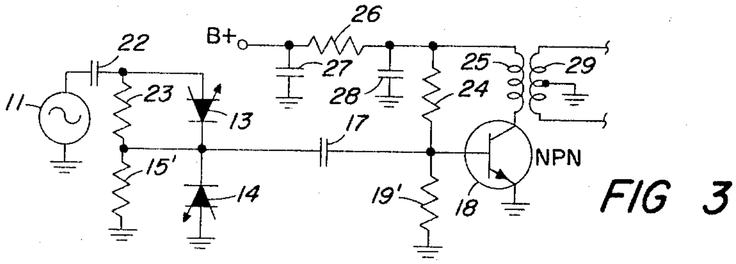
Figure 4:
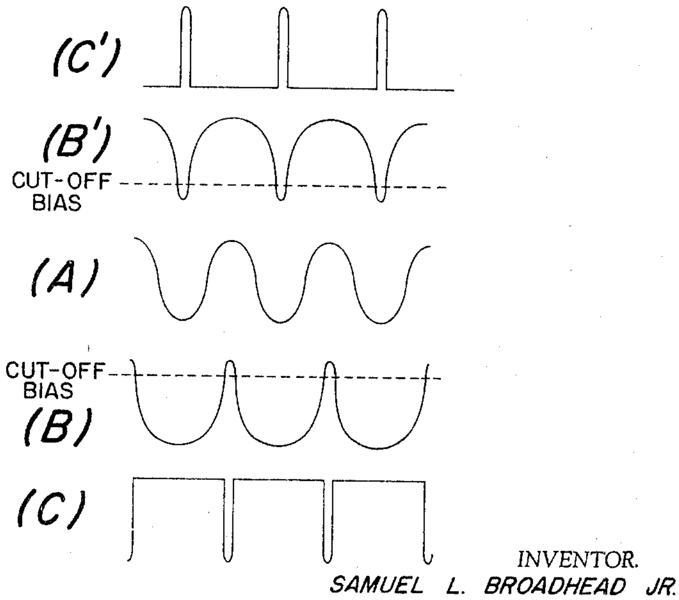

In the drawing:

FIGURE 1 represents a high frequency narrow pulse generator utilizing a NPN transistor amplifier for providing narrow amplified output pulses;

FIGURE 2, a pulse generator similar to the embodiment of FIGURE 1 utilizing, however, a PNP transistor, having the Varicaps reversed in orientation, and utilizing a negative voltage bias;

FIGURE 3 is another pulse generator similar in many respects to the embodiment of FIGURE 1, but with different signal coupling and biasing circuitry; and, FIGURE 4 includes signal waveforms developed at points A, B, C, B′ and C′ in the embodiments of FIGURES 1 and 2, with waveform A the applied reference input signal at points A, the waveforms B and B′ being the waveforms developed at the common junction of the Varicaps of the embodiments of FIGURES 1 and 2, respectively, and waveforms C and C′ the pulse waveforms developed at the transistor collector terminal outputs in the respective embodiments.

Referring to the drawing:

The pulse generator 10 of the FIGURE 1 embodiment is shown to be provided with a reference input signal source 11 connected between ground and a coil 12 acting as a choke to the anode of Varicap 13. It should be noted, howeevr, that some embodiments using a relatively high impedance signal source do not require impedance matching as provided by choke 12. The cathode of Varicap 13 is connected to the cathode of Varicap 14, the anode of which is connected to ground. The common junction between Varicaps 13 and 14 is connected through resistor 15 to ground and a resistor 16 is connected between the junction of signal source 11 and choke coil 12 and ground. Thus, a D.-C. circuit path is provided around each Varicap 13 and 14 from electrode to electrode with the component values chosen to give appropriate impedance for proper operation of the circuit. The resistor 16 could be replaced by a D.-C. circuit path through the signal source 11 and, as a matter of fact, many various signal sources do have a through D.-C. circuit path.

The voltage waveform developed at the common junction of Varicaps 13 and 14 is coupled through capacitor 17 to the base of NPN transistor 18. In order that NPN transistor 18 be biased for proper operation in the pulse generator circuit the base is connected through resistor 19 to ground, the emitter is connected to ground, and the collector is connected through resistor 20 to a B+ voltage supply. The collector is also provided with an output terminal connection 21.

The Varicaps 13 and 14 are a utilization of the voltage sensitive junction capacitive characteristics of semiconductor diodes as variable capacitance in a pulse generating circuit. These semiconductor devices are of the type comprising a P-N junction which, when forwardly biased (positive to the P-type material and negative to the N-type material) permit passage of current. When reverse biased (negative to the P-type material and positive to the N-type material) each blocks the flow of current with the junction of each exhibiting capacitance as an inverse function of the reverse bias. These devices are known, and may be, for example, those described in an article entitled "Semiconductor Variable Capacitors" by H. R. Smith in the December 1958 issue of Radio and T.V. News magazine, wherein such devices are defined as commercially available Varicaps and Semicaps. Because of the diode characteristics of these voltage variable capacitors (Varicaps) they may be described as being polarized in the sense that a diode is polarized, and may be referred to as including a cathode and an anode just as with a diode. These are illustrated in FIGURE 1, and in the other embodiments, as a composite representation of two parallel lines for capacitance, a diode symbol between the parallel lines to represent the polarization characteristics, and an arrow to indicate variability.

During operation of the pulse generator of FIGURE 1, as input voltage at A from signal source 11 goes positive, the voltage across Varicap 13 decreases and its capacitance increases, and simultaneously the voltage across Varicap 14 increases while its capacitance decreases. The FIGURE 4B waveform is produced at point B by this action. Transistor 18 is so self-biased with its base current that, consistent with the time constant of base coupling capacitor 17 and base to ground resistor 19, it conducts only the positive going peaks of the B waveform to provide the FIGURE 4C narrow negative going pulse waveform at the collector terminal 21. It should be noted that this circuit is capable of producing very narrow pulses since it does not use saturated semiconductor junctions with their inherent long recovery times. Such a pulse generator supplying driving pulses at 5 mc. to a "Multiple Crystal Frequency Selective Multiplier" with a highest harmonic output of 55 mc., supplies driving pulses less than $$\frac{1}{1.1\times 10^8}$$

seconds (9.2 nanoseconds) wide. Furthermore, the spacings of these driving pulses have been uniform to a very high degree of accuracy to occur through the same portions of coinciding output frequency cycles thereby minimizing, if not eliminating, any problems of phase jitter.

In the embodiment of FIGURE 2, components similar to those of FIGURE 1 are, for the sake of convenience, numbered the same. The reference input signal source 11′ has a through D.-C. path as indicated in phantom, thereby eliminating the requirements for a D.-C. path as provided through resistor 16 in FIGURE 1. In the FIGURE 2 embodiment, signal source 11′ is connected to the cathode of Varicap 13′, the anode of which is connected to the anode of Varicap 14′, the cathode of which is connected to ground. The common junction between Varicaps 13′ and 14′ is connected through resistor 15 to ground. This, a D.-C. path is provided around each Varicap 13′ and 14′ from electrode to electrode for proper operation of the circuit.

The voltage waveform developed at the common junction of Varicaps 13′ and 14′ is coupled through capacitor 17 to the base of PNP transistor 18′. PNP transistor 18′ is biased for proper operation with the base connected through resistor 19 to ground, the emitter connected to ground, and the collector connected through resistor 20 to a B− voltage supply; and is provided with a collector output terminal connection 21.

With operation of the FIGURE 2 embodiment, as input voltage at A from signal source 11′ goes negative, the voltage across Varicap 13′ decreases and its capacitance increases and simultaneously the voltage across Varicap 14′ increases while its capacitance decreases. The FIGURE 4B′ waveform is produced at point B′ by this action. PNP transistor 18′ is so biased with its base current that, consistent with the time constant of the base coupling capacitor 17 and base to ground resistor 19, it conducts only the negative going peaks of the B′ waveform to provide the FIGURE 4C′ narrow positive going pulse waveform at the collector terminal 21.

In the FIGURE 3 pulse generator embodiment, reference input signal source 11 is coupled through capacitor 22 to the anode of Varicap 13. The cathode of Varicap 13 is connected to the cathode of Varicap 14, the anode of which is connected to ground. Resistor 23 is connected between the anode of Varicap 13 and the common junction of Varicaps 13 and 14 and the resistor 15′ is connected between the common junction of Varicaps 13 and 14 and ground. Thus, a D.-C. circuit path is provided around each Varicap 13 and 14 from electrode to electrode through resistors 23 and 15′, respectively.

The voltage waveform developed at the common junction of Varicaps 13 and 14 is coupled through capacitor 17 to the base of NPN transistor 18. In order that NPN transistor 18 be biased for proper operation, its base is connected through resistor 19′ to ground, the emitter is connected to ground, while a positive voltage supply B+ is connected through a voltage dividing network including resistors 24 and 19′ to the base of transistor 18 and through coil 25 to the collector of transistor 18. The connection from the positive voltage supply also includes a resistor 26 connected between the positive voltage supply and the common junction of resistor 24 and coil 25. Resistor 26 is also part of a RF filter network including capacitors 27 and 28, useful for blocking RF from the B+ voltage supply. Coil 25 is also useful as pulse output coupling means to a secondary transformer coil 29 which may be coupled to utilizing equipment or circuitry not shown.

Thus, it may be seen that this invention provides very effective and efficient pulse generators capable of producing very narrow output pulses with precisely uniform spacings, particularly applicable for use where such stringent performance characteristics are important, as, for example, a frequency trigger pulse input for frequency multipliers.

Whereas this invention is here illustrated and described with respect to several specific embodiments thereof, it should be realized that various changes may be made without departing from the essential contributions to the art made by the teachings hereof.

I claim:

1. In a pulse generator, a reference frequency source; at least two like multielement solid state devices each having at least a first electrode and a second electrode, and including a P-N junction which, when forwardly biased, permits the passage of current, and having the characteristic, when reverse biased, of blocking the flow of current; and with the P-N junction of each exhibiting capacitance as an inverse function of the reverse bias; one of said solid state devices having a first electrode connected for receiving the reference frequency from said reference frequency source, and having a second electrode connected in common with the corresponding second electrode of the other multielement solid state device; said other multielement solid state device having the first electrode connected to a voltage potential reference source; first D.-C. path means parallel to one of said multielement solid state devices, and a second D.-C. path means parallel to said other multielement solid state device; means coupling the common junction of said multielement solid state devices to an amplifying device having multiple electrodes including an output electrode; and means biasing said amplifying device to conduct predetermined portions of a waveform developed at the common junction of said multielement solid state devices and coupled to said amplifying device.

2. The pulse generator of claim 1, wherein said multielement solid state devices are voltage variable capacitors comprising voltage sensitive P-N junction semiconductor diodes capable of conducting current when biased one way and having capacitive characteristics variable with bias level when reverse biased.

3. The pulse generator of claim 1, wherein said multielement solid state devices are voltage variabe capacitors, each having a cathode and an anode; with the common junction between the voltage variable capacitors being between like electrodes of the voltage variable capacitors; and wherein said means coupling the common junction to said amplifying device includes a capacitor.

4. The pulse generator of claim 3, wherein said amplifying device is a transistor having two P-N junctions; and means biasing said amplifying device includes a voltage supply having a polarity consistent with the orientation of the P-N junctions of the transistor.

5. The pulse generator of claim 4, wherein the means coupling the common junction of the voltage variable capacitors to said amplifying device includes a connection through said capacitor to the base of the transistor; and wherein said means biasing said amplifying device includes, in addition to the voltage supply, a connection of the transistor emitter to a voltage potential reference source, impedance means connected between the base of the transistor and said voltage potential reference source, and impedance means between said voltage supply and the collector of the transistor.

6. The pulse generator of claim 5, wherein the primary coil of a pulse signal coupling coil transformer is included in the circuit between said voltage supply and the collector of the transistor.

7. The pulse generator of claim 5, wherein the common junction is between cathodes of the voltage variable capacitors; the transistor is a NPN transistor; and the voltage supply is of positive polarity.

8. The pulse generator of claim 5 wherein the common junction is between anodes of the voltage variable capacitors; the transistor is a PNP transistor; and the voltage supply is of a negative polarity.

9. The pulse generator of claim 3, wherein both said first and second D.-C. path means include impedance means in each D.-C. path, and with each of said first and second D.-C. path means extending between the cathode and the anode of respective voltage variable capacitors.

10. The pulse generator of claim 9, wherein the said first D.-C. path means parallel to one of the voltage variable capacitors passes through said reference frequency source.

References Cited by the Examiner

UNITED STATES PATENTS

| | | | |
|---|---|---|---|
| 2,964,646 | 12/1960 | Helms | 307—88.5 |
| 3,046,414 | 7/1962 | Meissen | 307—88.5 |
| 3,139,535 | 6/1964 | Saito | 307—88.5 |
| 3,205,375 | 9/1965 | Berry et al. | 307—88.5 |
| 3,209,171 | 9/1965 | Amodei | 307—88.5 |

ARTHUR GAUSS, *Primary Examiner.*

J. S. HEYMAN, *Assistant Examiner.*